(12) United States Patent
Wong et al.

(10) Patent No.: US 6,590,394 B2
(45) Date of Patent: Jul. 8, 2003

(54) NMR PROBE WITH ENHANCED POWER HANDLING ABILITY

(75) Inventors: Wai Ha Wong, San Jose, CA (US); I-Jaung Feng, Portola Valley, CA (US)

(73) Assignee: Varian, Inc., Palo Alto, CA (US)

( * ) Notice: Subject to any disclaimer, the term of this patent is extended or adjusted under 35 U.S.C. 154(b) by 92 days.

(21) Appl. No.: 09/967,819

(22) Filed: Sep. 28, 2001

(65) Prior Publication Data

US 2003/0062896 A1 Apr. 3, 2003

(51) Int. Cl.[7] .................................................. G01V 3/00
(52) U.S. Cl. ........................................ 324/318; 324/322
(58) Field of Search ................................ 324/318, 322, 324/309; 600/407

(56) References Cited

U.S. PATENT DOCUMENTS

| | | | |
|---|---|---|---|
| 5,351,007 A | | 9/1994 | Withers et al. |
| 5,565,778 A | | 10/1996 | Brey et al. |
| 5,585,723 A | * | 12/1996 | Withers ....................... 324/318 |
| 5,594,342 A | | 1/1997 | Brey et al. |
| 5,619,140 A | * | 4/1997 | Brey et al. .................. 324/318 |
| 5,986,543 A | | 11/1999 | Johnson |
| 6,169,399 B1 | | 1/2001 | Zhang et al. |
| 6,201,392 B1 | | 3/2001 | Anderson et al. |
| 6,377,047 B1 | * | 4/2002 | Wong et al. ................ 324/318 |
| 2001/0029329 A1 | * | 10/2001 | Avrin et al. ................ 600/407 |

FOREIGN PATENT DOCUMENTS

EP              1 239 297 A2        9/2002

OTHER PUBLICATIONS

Software, "IE3D", Release 4, Zeland Software, 1997.
Book by Gupta, Garg and Bahl, entitled "Microstrip Lines and Slotline", published by Artech House, Inc., Chapter 3, 1979.

\* cited by examiner

Primary Examiner—Edward Lefkowitz
Assistant Examiner—Tiffany A. Fetzner
(74) Attorney, Agent, or Firm—Bella Fishman; Edward H. Berkowitz

(57) ABSTRACT

A phase-shifted coil comprises nested concentric spiral portions, the terminals of which are progressively offset. Separately tuned concentric such coils of different dimensions exhibit relatively close intercoil clearance in one dimension and relatively large clearances in the orthogonal dimension provide different flux return characteristics for selective RF coupling.

21 Claims, 10 Drawing Sheets

NMR PROBE WITH ENHANCED POWER HANDLING ABILITY

FIELD OF THE INVENTION

The invention is in the field of nuclear magnetic resonance (NMR) and pertains especially to superconducting probe coils realized on planar substrates.

BACKGROUND OF THE INVENTION

In an NMR apparatus of any type for the study of the properties of a body, the coupling of the apparatus to the body is critical and this coupling occurs through the agency of the probe coil. The probe coil applies the RF magnetic field to the body for excitation of resonance and, typically, also serves as the component on which the resonant signal is impressed by inductive coupling to the body or sample. The sensitivity of the apparatus depends to a great extent upon the nature and efficiency of this coupling. Recent years have seen the introduction of superconducting probe coils using high temperature superconducting (HTSC) films deposited on planar substrates in various geometries.

Factors which contribute to an efficient NMR coil include filling factor $\xi$, quality factor (Q) and intrinsic coupling efficiency $\zeta$. The filling factor is a geometric feature which measures the portion of the interior volume defined by the coil which is available to sample. Clearly, a large quantity of sample, which is excited and resonantly de-excites, contributes a larger signal. The coil may be observed to be characterized by a total inductance, however any portion of the capacitance which does not contribute to detected signal represents a loss of sensitivity. Q represents the ratio of the power stored in the field of the resonant circuit to the resistive losses in the resonant circuit. Sensitivity is proportional to $Q^{1/2}$. Accordingly, it is desirable to maximize the quantities $\xi$, $\zeta$ and Q.

HTS coils exhibit extraordinary high values of Q, ranging into the order of $10^4$. These coils are fabricated on planar substrates due to properties of the HTSC materials. Coils and coil pairs for this application are treated in the prior art. See, for example, U.S. Pat. No. 5,565,778. Unfortunately, the critical current, e.g., the maximum current which can be sustained in these HTSC conductors is limited due to perturbations of the superconducting phase.

In prior art, simple planar HTSC coils were known for NMR applications. See, for example, U.S. Pat. No. 6,201,392. It is known to employ a plurality of HTSC conductors in an arrangement of nested loops. See U.S. Pat. No. 5,594,342 to Brey and Withers. Each loop, as such, contributes an inductive reactance and to the extent that the nested loop is adjacent portions of inner and outer neighboring loops, a distributed capacitive reactive component is realized.

SUMMARY OF THE INVENTION

A requirement of the invention is to obtain a very high degree of uniformity in the RF magnetic field imposed on a selected volume. There is also an independent desire to avoid non-uniformity in the current density supported by the conductor(s) forming the coils. When such current density non-uniformity is experienced in HTSC devices, the superconducting phase may become unstable.

The geometry of the preferred embodiment of the invention is a nested arrangement of M (M, an integer) elemental spiral portions. The M elemental spirals exhibit a progression of dimensions to permit the nested arrangement. Each elemental spiral has an inner and an outer end. The inner (outer) ends of adjacent nested spiral elements are geometrically displaced by an angular amount $\Delta\theta$ to obtain a RF offset of $\Delta\Phi$ in relative phase. Preferably, the same relative phase is maintained for all adjacent pairs. Each adjacent pair of elemental spirals contribute a distributed capacitance coupling to the parallel inductances of the coil whereby a desired RF resonance characteristic is achieved.

It is desired to increase the RF current carrying capability of an HTSC probe coil and to achieve uniformity in the current density distribution over the coil. This is accomplished in a resonant structure comprising a plurality of closely adjacent concentric spiral conductors. Each spiral conductor supports a standing wave and the several spiral conductors are disposed to provide a phase shift relative to the adjacent spiral conductor(s). The magnitude of distributed capacitance between adjacent capacitors is thus a matter for design choice.

Multi-resonant HTS coils are realized with planar concentric phase shifted (rectangular) spirals with the inner coil designed for the high frequency resonance. The two coils are in close proximity on one planar dimension and relatively distal relationship on the other dimension, in order to direct the flux return regions for the two coils respectively to the outer periphery of the assembly for the outer coil and to the inter coil region for the inner coil. Opposite helicity for these coils is preferable where greater isolation is desired.

The coupling of the above multi-resonant coil to an RF source or sink may be selectively enhanced by the alignment of a coupling loop in respect to the flux return of the respective nested coils. Coupling to the outside coil portion may simply involve placing the projection of a simple coupling loop over the area defined by the outside loop. Selective coupling to the inner coil is accomplished with a butterfly loop, e.g. a series pair of loops of opposite helicity, the projection of which straddles the inside and outside portions of the inner loop.

While the invention is susceptible to various modifications and alternative forms, the above figures are presented by way of example and/or for assistance to understanding the structure or phenomena. It should be understood, however, that the description herein of the specific embodiments is not intended to limit the invention to the particular forms disclosed, but rather, the intention is to cover all modifications, equivalents, and alternatives falling within the spirit and scope of the invention as defined in the appended claims.

DETAILED DESCRIPTION OF THE INVENTION

Figure 1:
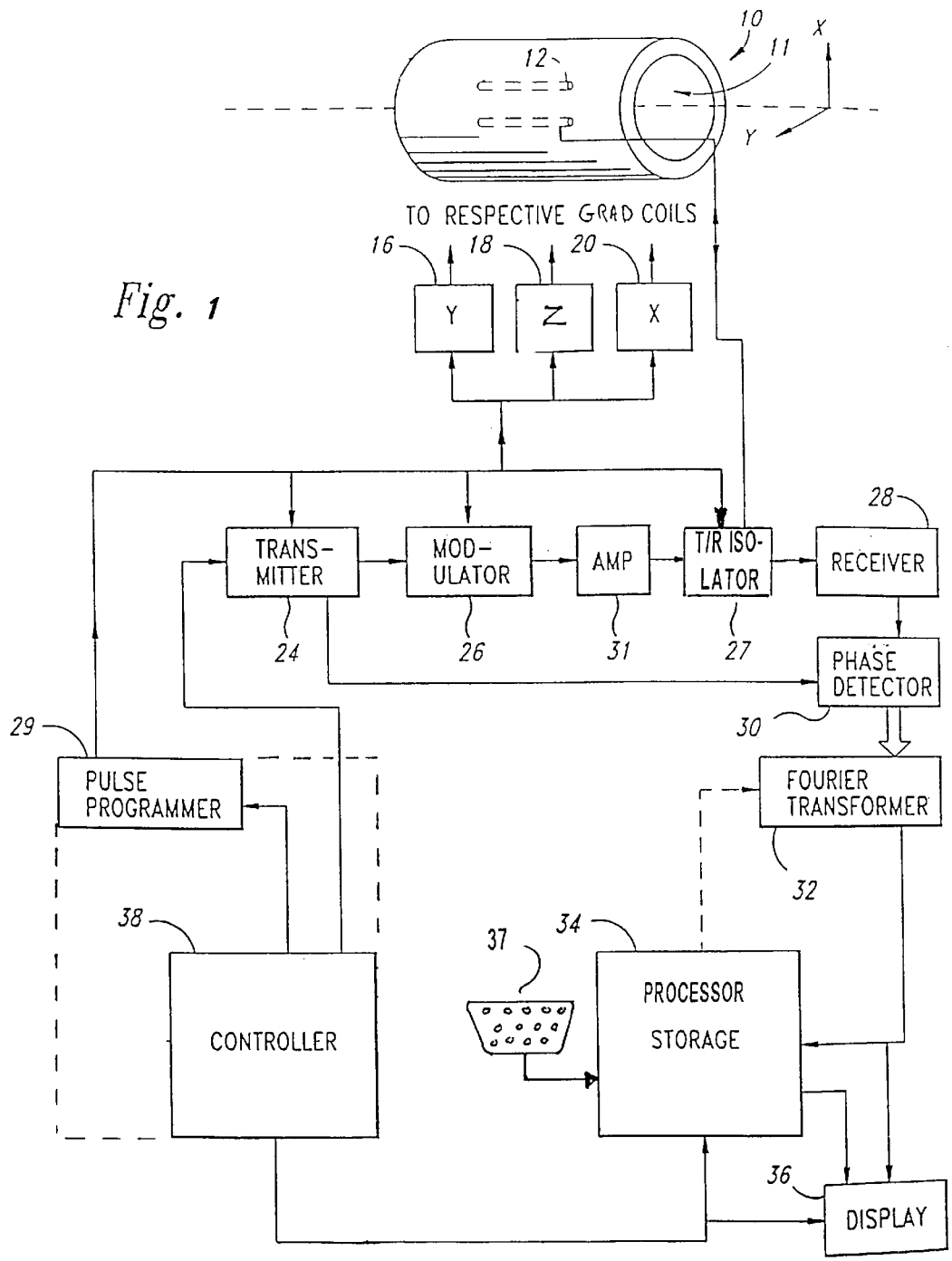
FIG. 1 schematically illustrates the context of the invention.

The physical context of the invention is an NMR apparatus. An idealized illustration is shown in FIG. 1. A magnet 10 having bore 11 provides a main magnetic field. X and Y are axes of coordinates of the magnet 10. In order to control the magnetic field with precision in time and direction, there are provided magnetic field gradient coils (not shown). These are driven by gradient power supplies 16, 18 and 20, representing components of gradient Y, Z, X coils, respectively. Additionally, other shimming coils (not shown) and power supplies (not shown) may be compensating residual undesired spatial inhomogeneity in the basic magnetic field. An object for analysis (hereafter "sample") is placed within the magnetic field in bore 11 and the sample is subject to irradiation by RF power, such that the RF magnetic field is aligned in a desired orthogonal relationship with the magnetic field in the interior of bore 11. This is accomplished through a transmitter coil 12 in the interior of bore 11. Resonant signals are induced in a receiver coil probe, proximate the sample within bore 11. The transmitter and reciver coils may be the identical structure or separate structures.

As shown in FIG. 1, RF power is provided from transmitter 24, and is amplified by an amplifier 31 and then directed via transmit/receive (T/R) isolator 27 to the transmitter coil probe 12 that includes RF transmitter coil located within the bore 11. The transmitter 24 may be modulated in amplitude or frequency or phase or combinations thereof, either upon generation or by a modulator 26. Additional transmitter modulator (not shown) as transmitter 24/modulator 26 components are often employed to independently excite different gyromagnetic resonators, e.g., protons and C13. These independent excitations are conveniently supported by a multi-resonant coil as described herein. Transmit and receive functions are not concurrently active. The identical coil within the transmitter coil probe 12 may be employed for both functions if so desired. Thus, the T/R isolator 27 is provided to separate the receiver from the transmitter. In the case of separate transmitter and receiver coils, element 27 will perform a similar isolation function to control receiver operation.

The modulator 26 is responsive to controller 38 including pulse programmer 29 to provide RF pulses of desired amplitude, duration and phase relative to the RF carrier at pre-selected time intervals. The pulse programmer may have hardware and/or software attributes. The pulse programmer also controls the gradient power supplies 16, 18 and 20, if such gradients are required. These gradient power supplies may impose gradient pulses or maintain selected static gradients in the respective gradient coils if so desired.

The transient nuclear resonance waveform is processed by receiver 28 and further resolved in phase quadrature through phase detector 30. The phase resolved time domain signals from phase detector 30 are presented to Fourier transformer 32 for transformation to the frequency domain in accordance with specific requirements of the processing. Conversion of the analog resonance signal to digital form is commonly carried out on the phase resolved signals through analog to digital converter (ADC) structures which may be regarded as a component of phase detector 30 for convenience.

It is understood that Fourier transformer 32 may, in practice, act upon a stored (in storage unit of processor 34) representation of the phase resolved data. This reflects the common practice of averaging a number of time domain phase resolved waveforms to enhance the signal-to-noise ratio. The transformation function is then applied to the resultant averaged waveform. Display device 36 operates on the acquired data to present to for inspection. Controller 38, most often comprising one or more digital processors, controls and correlates the time critical operations, such as the performance of pulse sequences. Controller 38 ordinarily incorporates an independent time base for maintaining synchrony with resonant spin systems. Overall operation of the entire apparatus within processor 34 includes input 37 from operating personnel, non-time critical calculation and output for further processing or display.

Figure 2A:
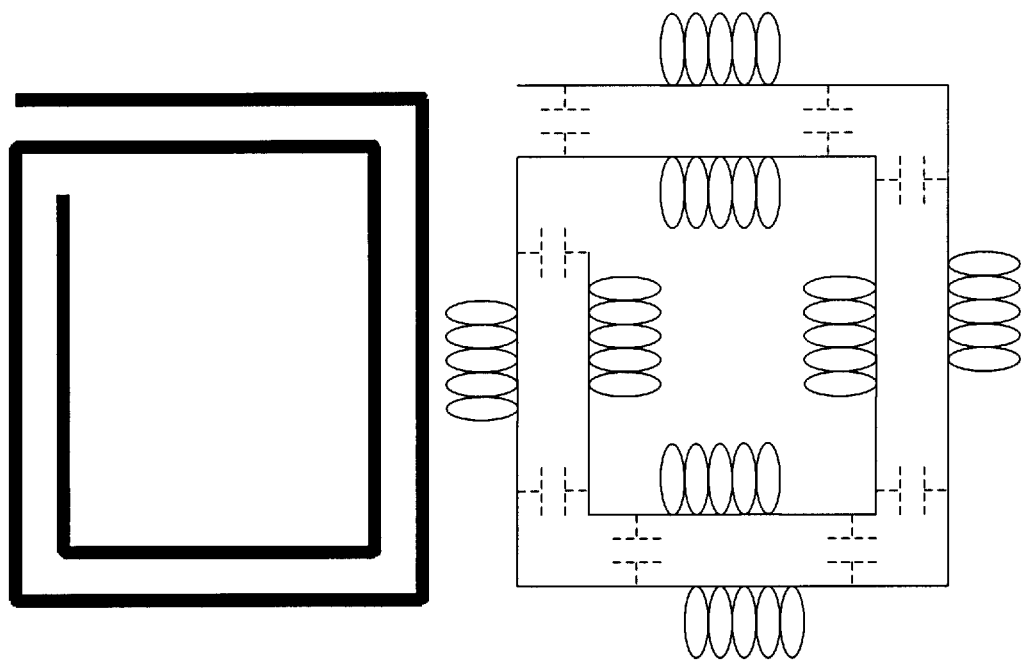
FIG. 2a is a simple spiral of prior art together with its equivalent circuit.

FIG. 2a is a known simple spiral for a RF coil in NMR apparatus. The equivalent circuit illustrates the distributed inductances and distributed capacitive couplings in an obvious format. One objection to such simple spiral coils is topological in nature: the interior and exterior terminals must be brought to a common region, for implementation of a resonant capacitor by way of example. In the HTS implementation, this requires a crossover that is difficult to achieve. Another problem with such a coil is that the inductance is greater than desired and the distributed capacitance rather less than desired for achieving typical resonant frequencies of the order of hundreds of megahertz. However, the simple spiral coil provides excellent current density distribution properties, and thus satisfactory magnetic homogeneity and thermal uniformity.

Figure 2B:
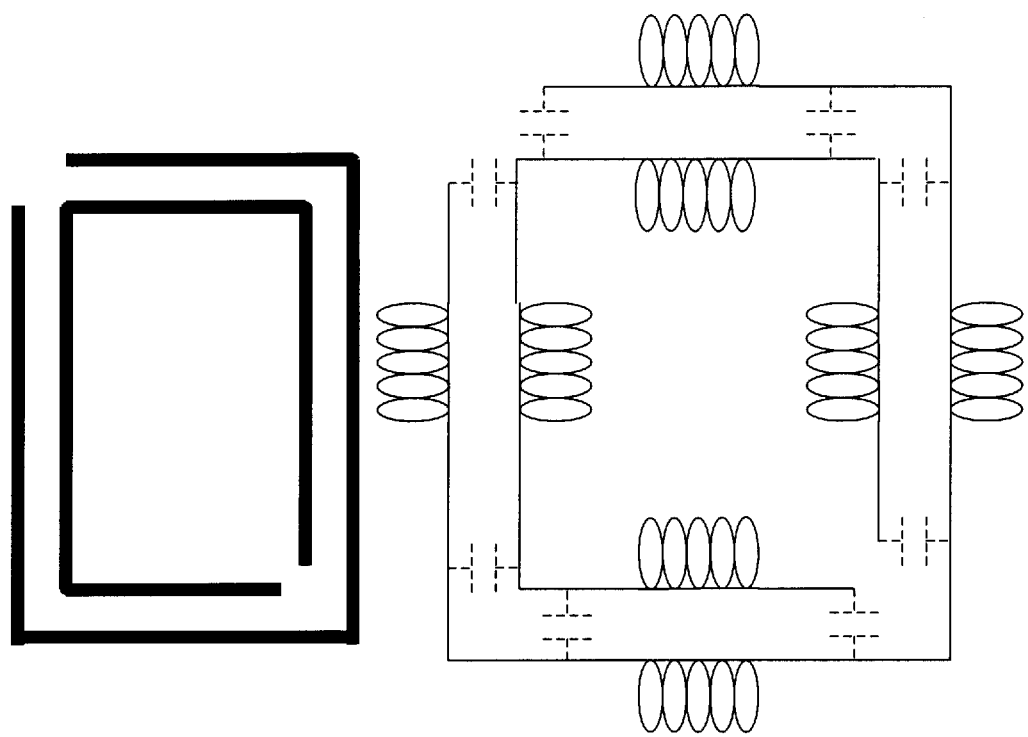
FIG. 2b is another spiral resonator of prior art together with its equivalent circuit.

FIG. 2b shows the geometry of another form of prior art coil arrangement used in NMR apparatus. Each prior art conductor subtends close to $2\pi$ with a small gap introduced. These arrangements often featured coupling of nested coils in the form of an inter-digitated capacitive coupling. These coils supply a greater capacitance in relation to the inductance, as desired, but the current density distribution is not optimal because the maximum RF current cannot be achieved. Such coils are the subjects of U.S. Pat. Nos. 5,351,007; 5,594,342; and 5,986,543.

Figure 3A:
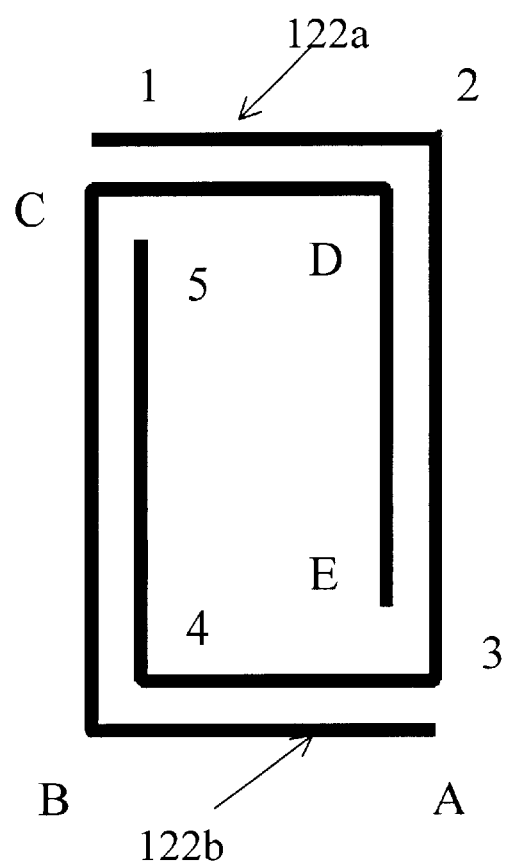
FIG. 3a is a 2 pole elemental $\pi$ phase shifted spiral ($2\pi$/turn) coil for the present invention together with its equivalent circuit
Figure 3A:
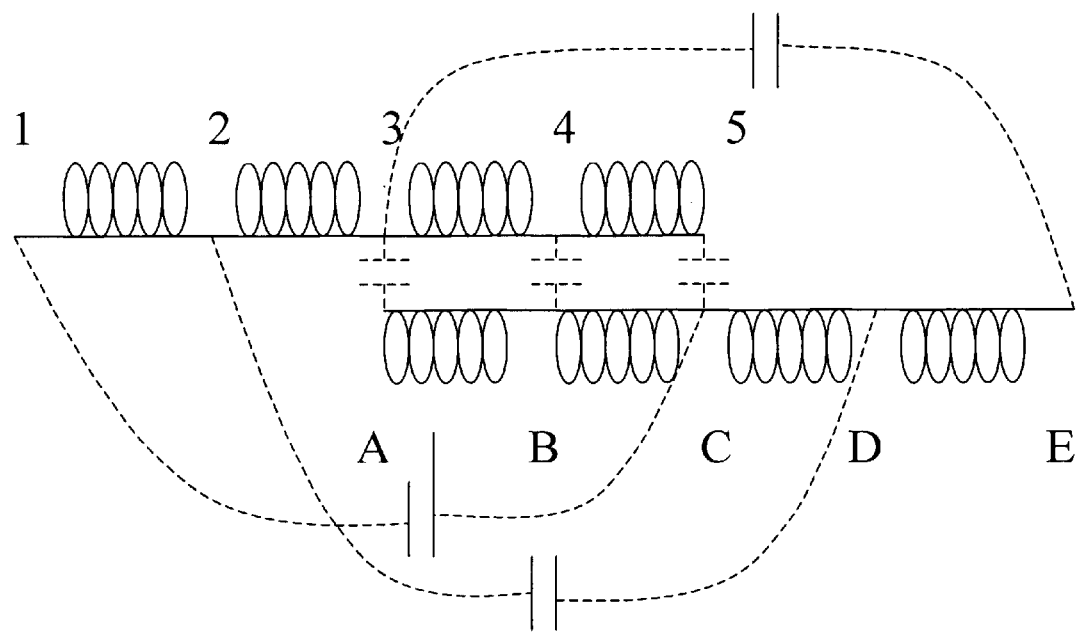
Figure 3B:
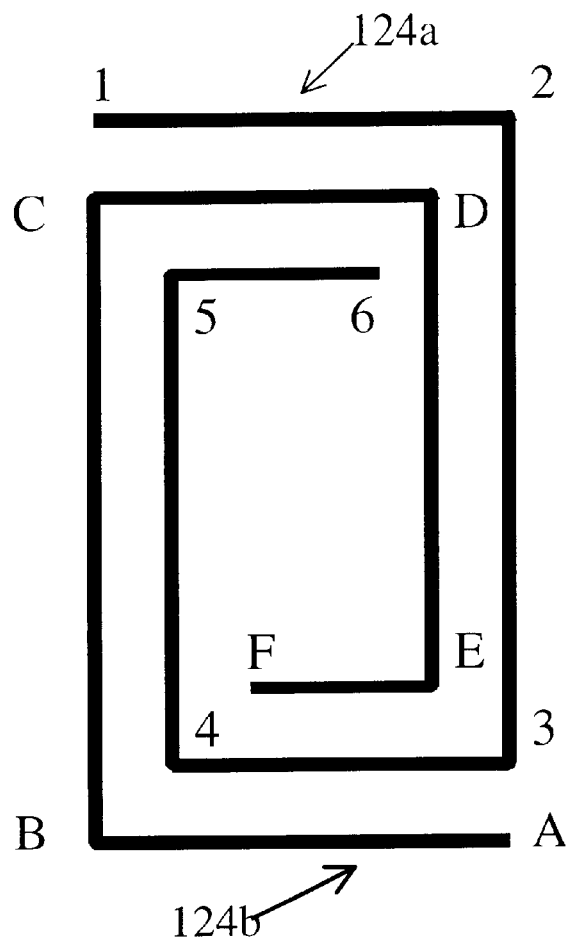
FIG. 3b is a 2 pole elemental $\pi$ phase shifted spiral ($9\pi/2$/turn) coil for the present invention.
Figure 3B:
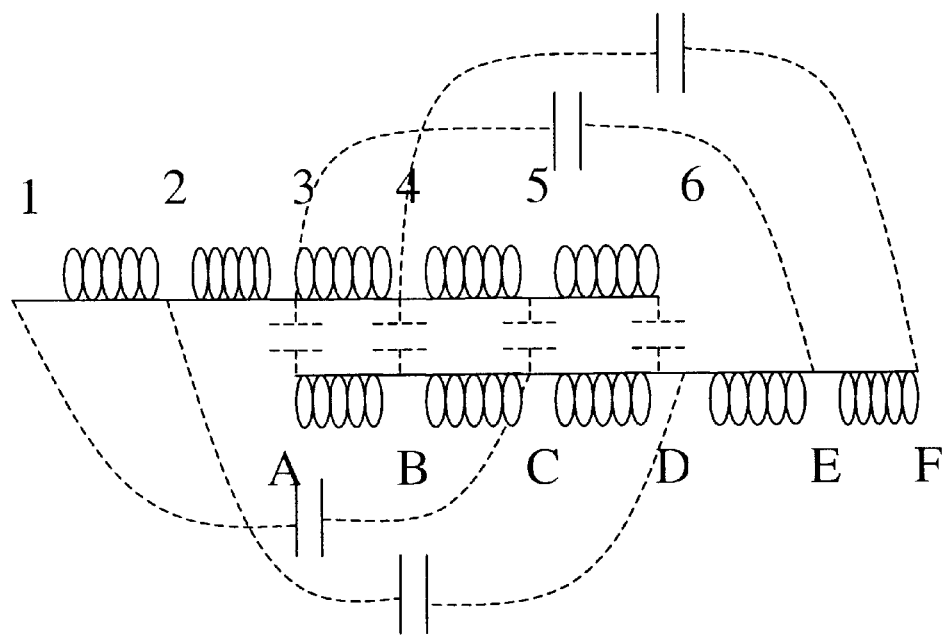

In contrast to both the simple spiral and the nested spirals of prior art, the phase shifted spiral coil of the present invention provides substantial designed capacitance to balance the inductance for desired resonant behavior. The structure of the present invention includes a plurality of elemental spirals, nested concentrically and phase shifted in respect of adjacent elemental spirals. Examples of elemental spiral conductors for use in the present invention are illustrated in FIGS. 3a–b with respective equivalent circuits. Comparison of the equivalent circuit and coil of FIG. 3a is aided by the numeric/alphabetic labeling of the respective spiral conductors. Elemental nested spiral pairs 122a and 122b subtend a plane angle of $2\pi$; spirals 124a and 124b subtend an angle of $9\pi/2$. These are simple examples and it is emphasized that any arbitrary plane angle may be selected subject to other desired specifications to realize a phase shift between adjacent conductors. The number of nesting spirals forming a given coil is determined by the capacitance to be achieved for the inductance of the limited by the mechanics of coil construction, e.g., lithography.

Comparing the embodiment of FIG. 3a with the analogous prior art of FIG. 2c, one may conclude that these are electrically equivalent. The difference is apparent in the respective topologies. The coil of FIG. 3a has displaced the two nested loops whereas the inner loop of FIG. 2c is completely surrounded by the outer loop. Although electrically equivalent at this level (2 turn, 2 pole) of example, the nesting of further loops in accordance with the invention offers certain advantages over nesting additional turns in the prior art coil. First, additional turns, or portions of turns are easily incorporated into a basic coil to add desired electrical characteristics. The equivalent circuit is now augmented by the inductance of the additional turn portions together with their respective distributed capacitive couplings to respective segments such as 2–3 and 5–4 as labeled in the figure. Note that additional turns in the prior art topology are capable of adding LC elements only in parallel with the basic equivalent circuit, whereas the phase shifted nested spiral of the present invention permits addition of such elements (turns or partial turns) of the equivalent ladder circuit producing incremental variations thereof.

A second advantage of the phase-shifted coils of the present invention is a distribution of RF current, which is more evenly distributed over the coil. Consider how the capacitive coupling of the prior art of FIG. 2b (with additional nested turns, not shown) is such that the outer turn couples only to the adjacent turn and the inner turn couples only to the adjacent turn. Intermediate turns couple to each adjacent turn. In contrast, consider the present invention, as for example, FIG. 4, wherein only a portion of an outside (inside) turn couples to the adjacent respective turn, after which the balance of that turn is in capacitive coupling relationship with adjacent turns on both inner and outer directions.

A critical distinction between the prior art coils of FIG. 2b and the coils of the present invention (FIGS. 3a–b, for example) is evident by consideration of the distribution of capacitance between one pair of nested coils of the prior art and the invention. For pedagogical purposes, consider the distributions of current and voltage over the elongated total length of nested coils of both types. At the terminal ends of either coils of the prior art or the invention, the RF voltage is maximum and the RF current vanishes. Intermediate the terminals, the RF voltage decreases to a minimum and the RF current rises to some maximum. The capacitance between adjacent nested conductors clearly depends upon the voltage difference. For the prior art case, this difference is minimal in respect to the small gap prescribed by FIG. 2b prior art. For the present invention, the phase shift represents a selected overlap between conductors that, upon superposition of a number of nested coils, accumulates a greater magnitude of capacitance proximate the ends of the conductor than could be obtained in prior art.

Figure 4A:
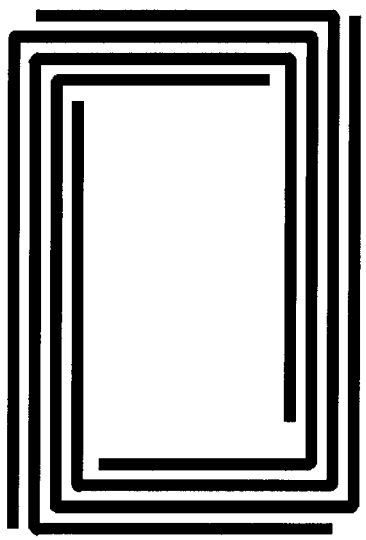
FIG. 4a is a 4-pole, $\pi/2$ phase shifted spiral coil ($2\pi$/turn) of the present invention together with its equivalent circuit.
Figure 4A:
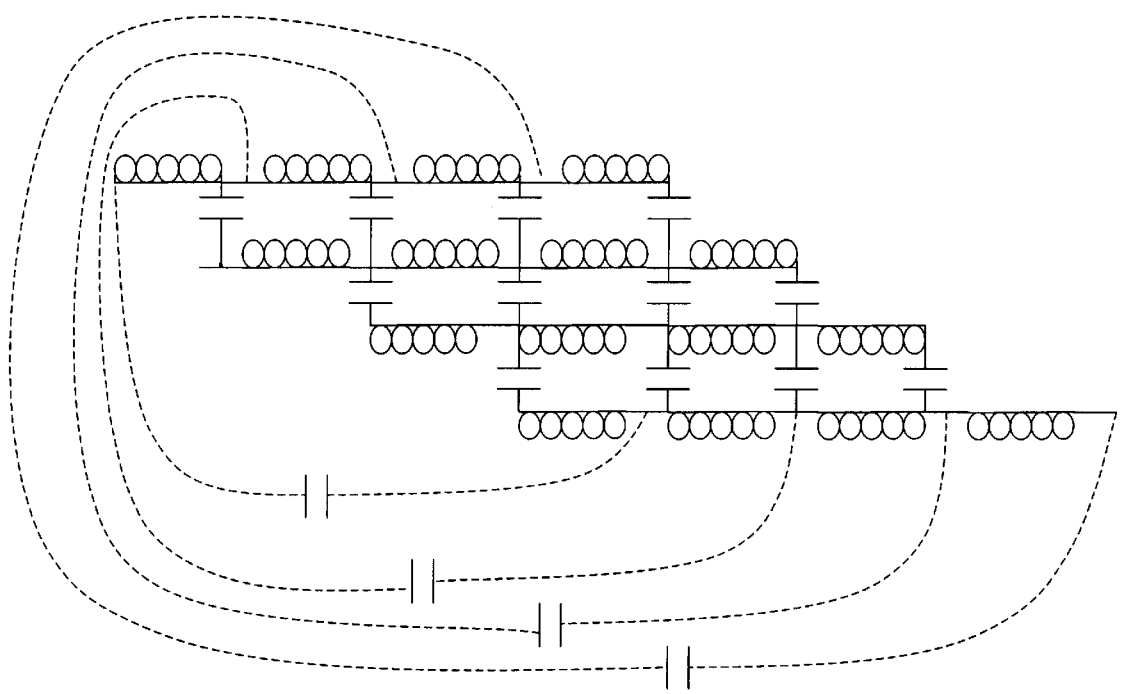
Figure 4B:
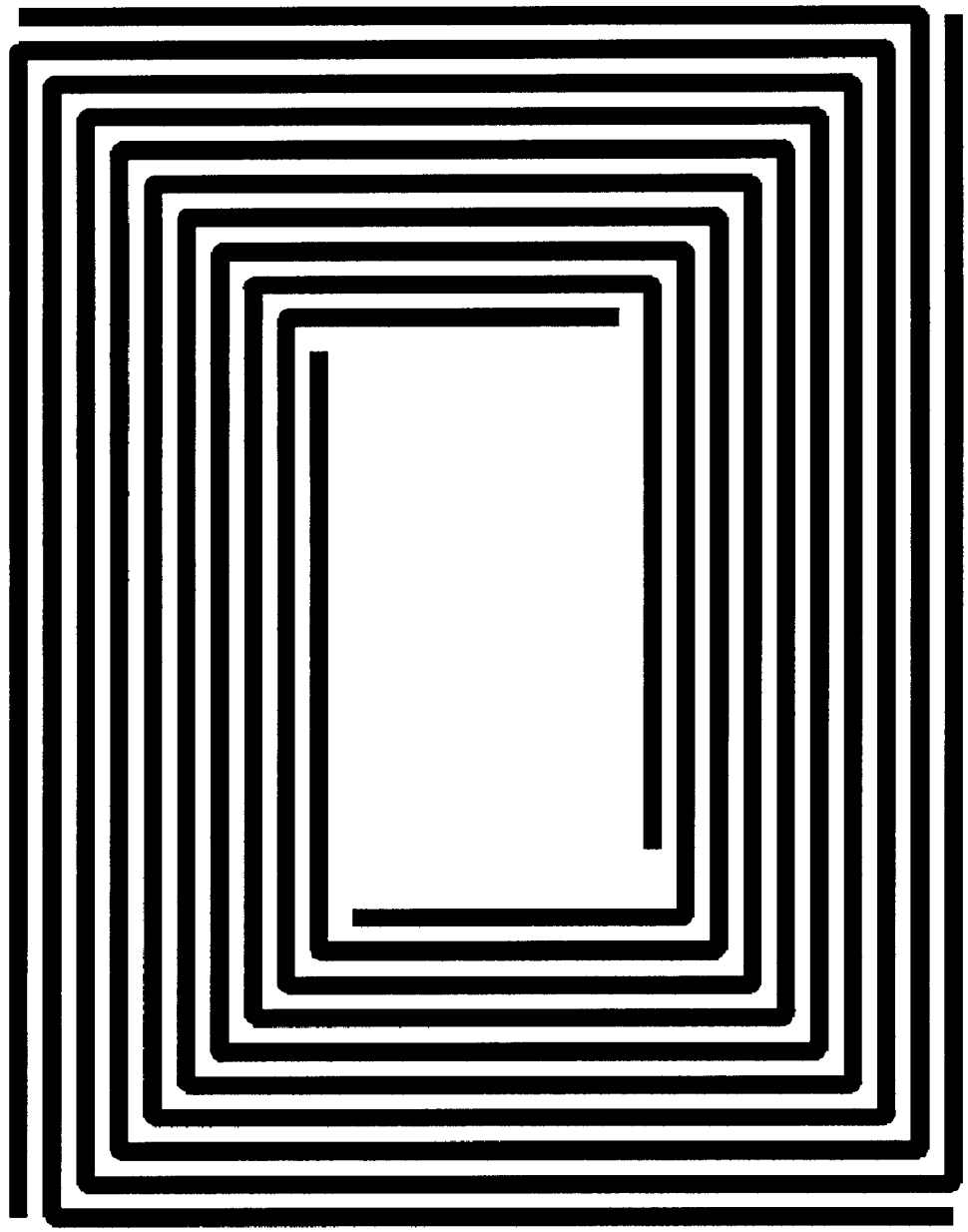
FIG. 4b is a 4-pole, $\pi/2$ phase shifted example ($5\pi$/turn) of the present invention.

FIG. 4a is a 4-pole elemental $\pi/2$ phase shifted spiral and the equivalent circuit which is expanded in FIG. 4b to produce a $\pi/2$ phase offset RF coil of 10 turns and 4 (distributed) capacitors. The equivalent circuit is shown in ladder form with conventional circuit symbols for identical capacitance and identical inductance. Distributed capacitance is realized from the distributed capacitive coupling of adjacent nested spiral conductors. A wide variety of techniques are known for coupling an RF source or sink to a coil or coil pair constructed in accord with the invention. It is preferred to dispose a coupling loop (not shown) proximate a portion of the coil for inductive coupling to the RF transmitter or to the receiver (preferred for the present invention).

The discussion above has been directed largely to an elemental portion of a coil formed from nested portions, and in the case of HTS coils, disposed within a planar substrate. It should be understood that in a practical instrument, coils are situated as Helmholtz pairs surrounding a sample under investigation. A classic Helmholtz pair consists of two identical series coils displaced along a common symmetry axis normal by a distance substantially equivalent to the coil radius. It can be demonstrated that this configuration produces a rather substantially uniform field distribution in the region intermediate the two coils, where a sample for investigation is ordinarily disposed. For in vivo measurements, a single coil may be applied close to the surface of a sample, and this geometry is frequently employed in medical imaging situations.

Figure 5A:
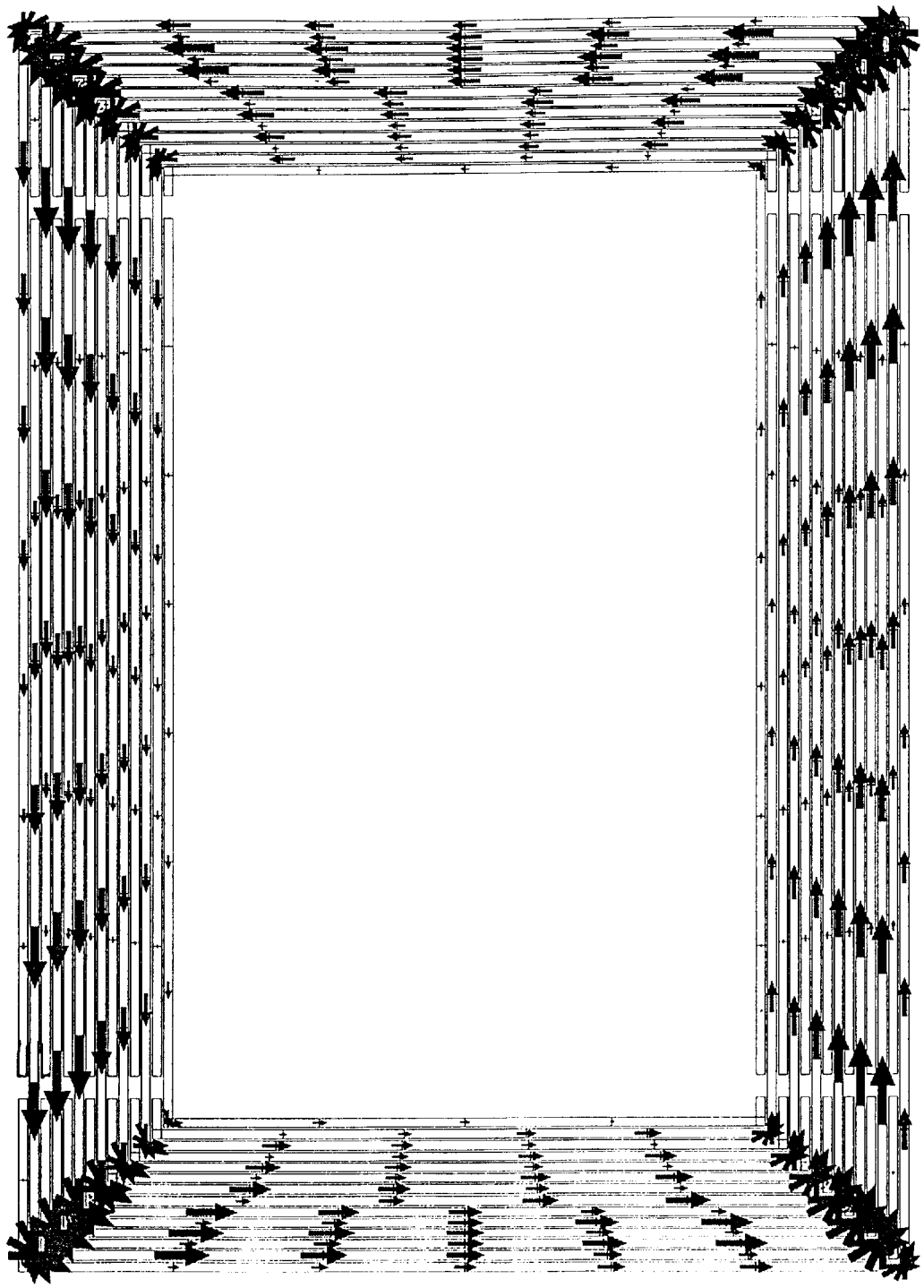
FIG. 5a illustrates the current density distribution for a 10 turn spiral resonator of prior art.
Figure 5B:
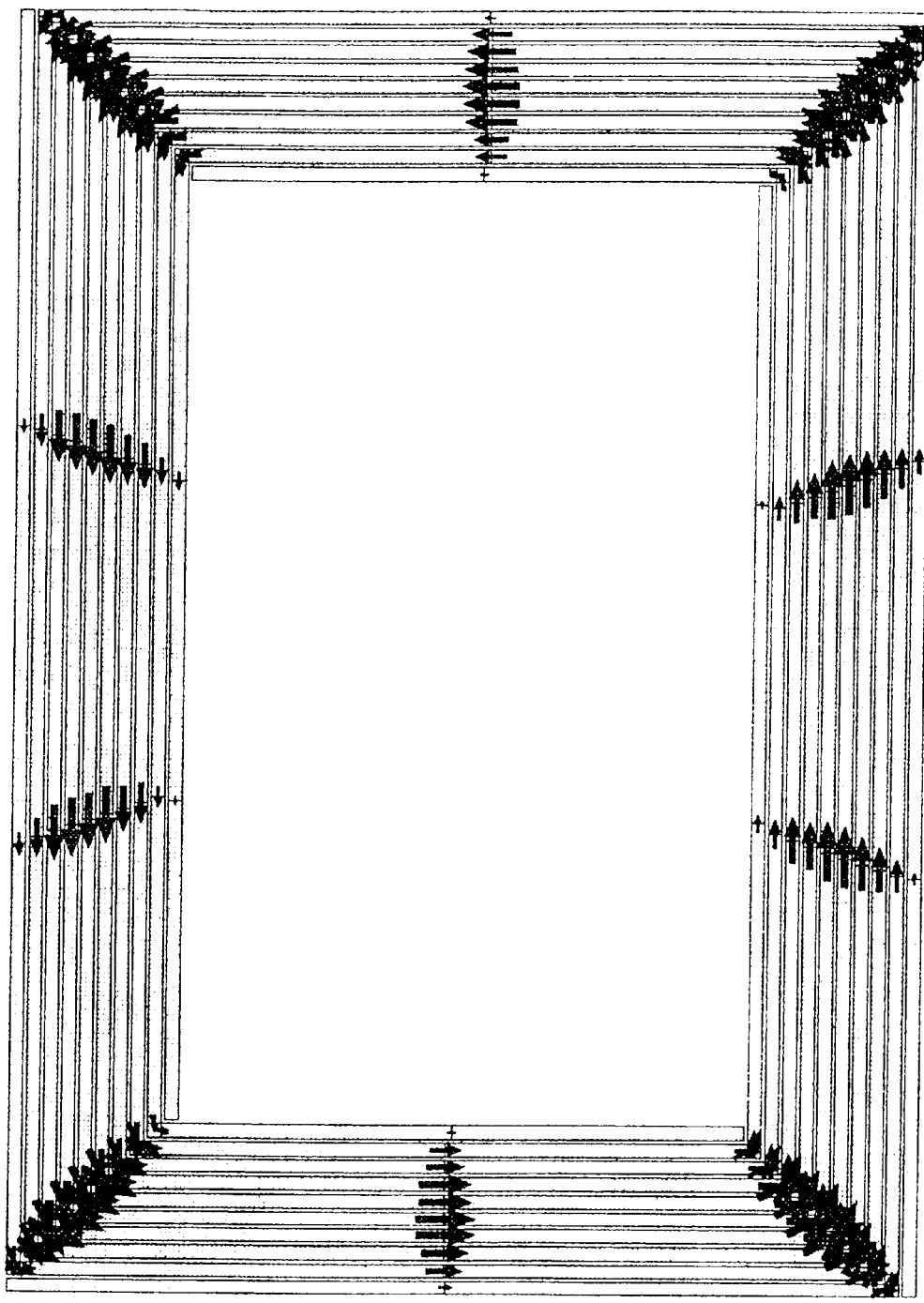
FIG. 5b illustrates the current density distribution for the resonator of FIG. 3.

In order to compare the current density distribution for the invention and the prior art, the coils to be compared share certain common design properties, e.g., the same outer dimensions and same resonance frequency. FIG. 5a shows the current density distribution obtained for the prior art coil design (of FIG. 2b) and FIG. 5b shows the current density distribution achieved for a 10-turn, 4-capacitor design of the present invention. These plots exhibit current in a specific conductor at a given location wherein the current magnitude is roughly expressed in the size of the arrow symbol. It will be observed that in relation to the prior art of FIG. 5a, the invention (FIG. 5b) provides for a more uniform current distribution by visually summing over adjacent conductors and considering the distribution along the length of the conductor segment. These current density distributions are obtained by integral equation calculation with the aid of the software, "IE3D", release 4, (Zeland Software, 1997)

The guiding desiderata for a NMR probe coil is the uniformity of the resulting RF magnetic field in the interior sensitive volume of the probe, a minimal RF electric field in that sensitive volume and a high Q value for the probe coil. These characterize the near field radiation properties of the desired coil. While these properties are especially important for NMR applications, such properties are also useful in components for other RF applications, such as magnetic resonance imaging, nuclear quadrupole resonance for metal detection or certain element specific detection, or the like.

An instructive analogy for the desired structure is the implementation of the coupled line filter implemented in a micro strip line. See Gupta, Garg and Bahl, "Microstrip Lines and Slotlines" Chpt. 3, (Artech, 1975). Such stripline components present functional specifications independent of the field distribution over the dimensions of the stripline component. Although the resonant behavior of the coil follows from employment of distributed inductance and capacitive couplings as for striplines, an overriding object of the present invention is the production of RF magnetic field uniformity in the exterior region proximate the coil itself.

Figure 6:
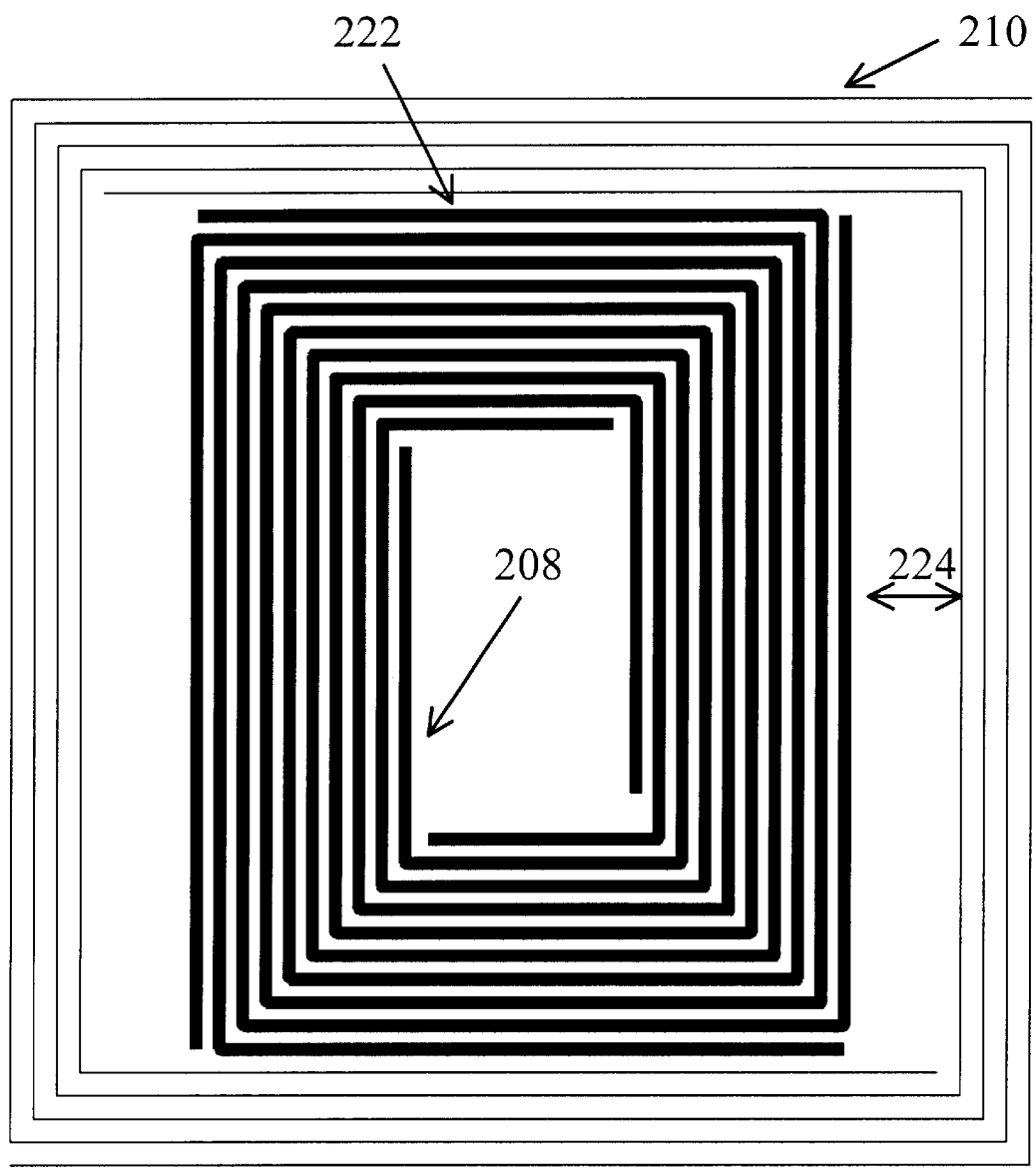
FIG. 6 illustrates a double resonant structure of the invention for two widely spaced resonance.
Figure 7:
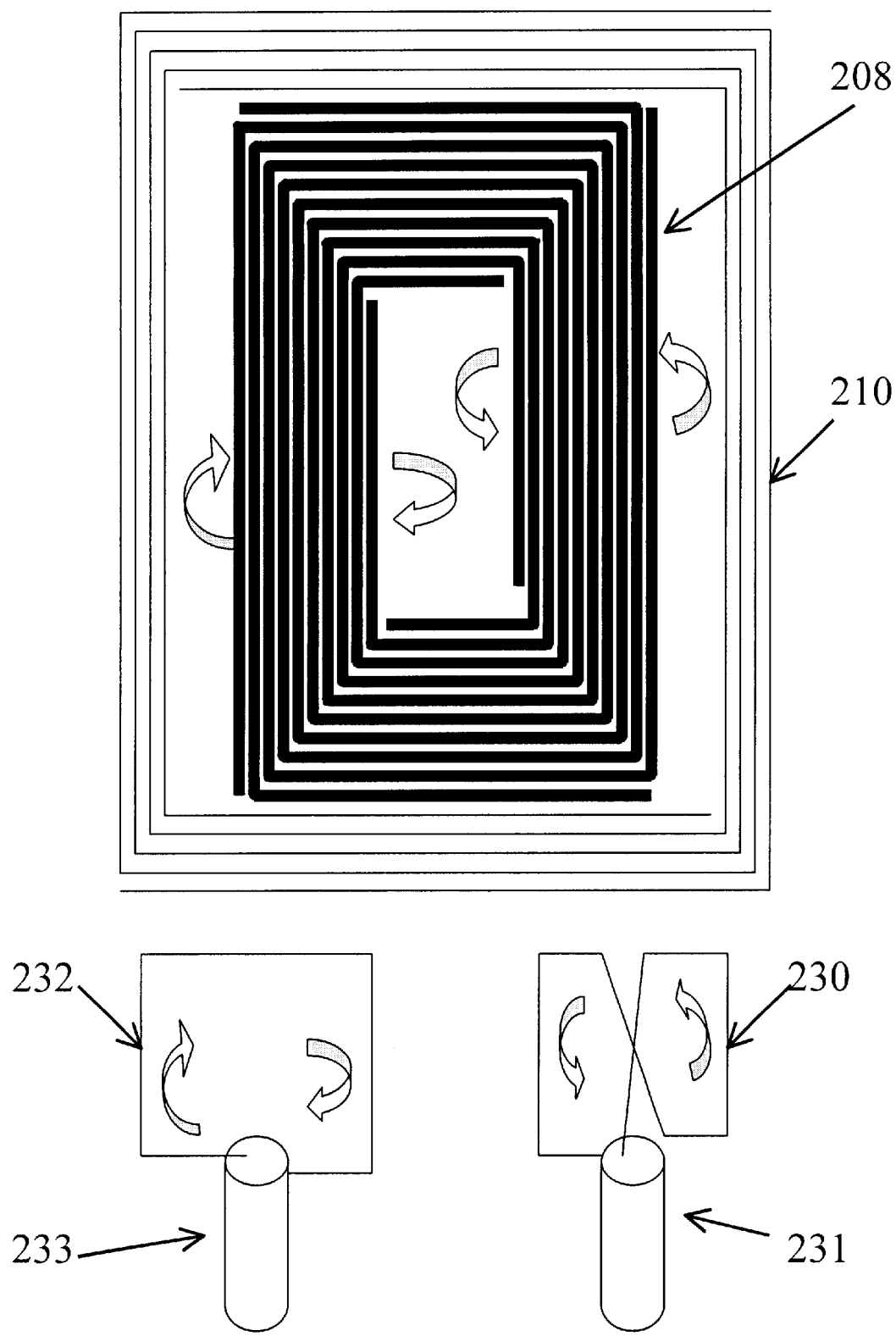
FIG. 7 shows an arrangement for selectively coupling to the concentric double resonant structure of FIG. 6.

Double resonant coil structures are easily achieved. The double arrangement, one planar member of which is shown in FIG. 6 consists of a pair of planar concentric phase-shifted spiral coils, symbolically designated 208 and 210, each designed for respective resonance performance, designated for convenience as "hi" and "lo". The innermost coil 208 comprises a phase-shifted coil in accord with the invention and is resonant at the higher frequency. The outer coil 210 is also preferably a phase-shifted coil of the present invention. At the extremes in the Y direction, the two coils are disposed in the closest proximity, limited only by mechanical considerations. Thus, the separation of coils (for flux return path) 222 will be limited for flux from inner coil 208 to the outside of the assembly. Along the X direction, the coils are separated by a relatively large gap 224 providing a flux return area for the inner (hi) coil. The choice of dimension for the gap is a trade-off between relative isolation of the two RF channels and increased efficiency for the outer coil. In one example, the inner coil is a 90° phase shifted spiral of 10-turns and 4 distributed capacitance selected to tune to resonance at 600 MHz. The outer coil is a 90° phase-shifted spiral of 20-turns and 2 distributed capacitance selected to tune to resonance at 100 MHz. The outer dimensions of the inner coil are 1.2 cm×1.0 cm with a turn spacing of 2 mm. The inner/outer dimensions of the outer coil are 1.6 cm×1.8 cm/1.5 cm×1.7 cm with a turn spacing of 1 mm. FIG. 7 describes a preferred coupling arrangement whereby the inner coil is selectively coupled to its RF source by a butterfly loop 230 driven from coaxial cable 231 whereas the outer loop is selectively coupled to its RF source by a simple coupling loop 232 driven from coaxial cable 233. The butterfly loop is disposed so as to exhibit projection on both inner and outer regions of the inner coil 208. This disposition accommodates the direction of the flux associated with the inner region of inner coil 208, which flux is oppositely directed compared to coil 208 flux in the outer region thereof. The flux direction associated with the outer loop over both of these regions is of constant direction within the region intercepted by the butterfly loop. The single coupling loop 232 is similarly disposed to project on both inner and outer regions of the inner coil (within the interior region of the outer coil) and essentially intercepts no net flux associated with the inner coil.

These concentric coils are disposed with opposite helicity, providing a greater degree of isolation. The resulting multiple coil structure is such that the inner (hi) coil 208 is substantially transparent to the outer (lo) coil 210. (In certain other applications the helicity might be chosen otherwise to promote coupling therebetween.). As previously indicated the practical form of the above-described double-resonant coil structure comprises two such coils arranged as a Helmholtz pair. A variation of this double resonant NMR probe comprises another Helmoltz pair of double resonant coils, designed for another unique pair of resonant frequencies and oriented to the first pair. Such a quadrupole-resonant probe may be independently tuned and coupled.

Although this invention has been described with reference to particular embodiments and examples, other modifications and variations will occur to those skilled in the art in view of the above teachings. It should be understood that, within the scope of the appended claims, this invention may be practiced otherwise than as specifically described.

What is claimed is:

1. A planar MR/RF coil exhibiting desired RF resonant properties, comprising:
    a plurality of substantially concentrically nested elemental spiral conductors, each said elemental spiral conductor having an inner end being confined within an inner side of the MR/RF coil and an outer end disposed within an outer side of the MR/RF coil, the inner ends of adjacent said elemental spiral conductors geometrically displaced towards each other by an angular amount $\Delta\theta$ to obtain a desired RF offset phase difference($\Delta\Phi$).

2. The MR/RF coil of claim 1, wherein said angular amount $\Delta\theta$ is a plane angle of about $2\pi/N$, wherein N is a number of said elemental spiral conductors.

3. The MR/RF coil of claim 1, wherein said adjacent elemental spiral conductors comprise a selected distributed capacitive coupling across the MR/RF coil that allows for accumulation a substantial magnitude of capacitance between said adjacent elemental spiral conductors resulting in uniform current density distribution across the MR/RF coil.

4. The coil of claim 3 wherein said capacitive coupling allows for accumulation a substantial capacitance proximate the end of said elemental spiral conductors clue to the RE phase difference between adjacent elemental conductors.

5. The MR/RF coil of claim 2 wherein each said elemental conductor is of such length to substantially support a standing wave of desired resonant properties.

6. The MR/RF coil of claim 5, further comprising a second plurality of substantially concentrically nested elemental spiral conductors, each said elemental spiral conductor of said second plurality also having an inner end being confined within an inner side of the MR/RE coil and an outer end disposed within an outer side of the MR/RF coil, the inner ends of adjacent said elemental spiral conductors disposed relatively offset towards each other by an angular amount $\Delta\theta_1$ to obtain a desired RF offset phase difference therebetween, said first and second plurality of said elemental spiral conductors being spaced apart to form a Helmholtz pair of coils.

7. The MR/RF coil of claim 5 wherein said RF phase difference $\Delta\Phi$ is constant for all said adjacent elemental spirals.

8. The MR/RF coil of claims 6, wherein said first and second pluralities of substantially concentrically nested elemental spiral conductors are substantially identical.

9. The MR/RF coil of claim 8, wherein the normal to each coil plane is opposing and co-linear.

10. The MR/RE coil of claim 5, wherein said spiral conductors are disposed on a planar substrate.

11. The MR/RE coil of claim 10, wherein said conductors comprise HTS materials.

12. A planar RF resonant coil component comprising:
    at least two closely spaced, concentric spiral conductors,
    each said spiral conductor having an inductance each pair of said spiral conductors having a distributed capacitance and a mutual inductance therebetween, whereby at least one resonant frequency characterizes said planar RF resonant coil component,
    each said spiral conductor supporting a standing wave corresponding to at least one said resonance.
    each said spiral conductor geometrically displaced in relation to at least one of the adjacent spiral conductors by an angular amount $\Delta\theta$ whereby a phase shift is introduced therebetween that allows for the accumulation of a substantial capacitance due to an RF offset phase difference $\Delta\Phi$.

13. A multi-resonant planar MR/RF coil structure comprising:
    nested inner and outer adjacent spiral conductors coaxially disposed on a common substrate forming outer and inner MR/RF coils respectively, each said spiral conductor of said outer and inner MR/RF coils having an inner end being confined within an inner side of the respective MR/RF coil and an outer end disposed on an outer side of the respective MR/RF coil, the inner ends of said adjacent elemental spiral conductors geometrically displaced towards each other by an angular amount $\Delta\theta$ to obtain a desired RF offset phase difference $\Delta\Phi$,
    said outer MR/RF coil having first and second symmetry axes on said surface,
    said inner MR/RF coil closely approaching the outer coil along said first axis and said inner MR/RF coil spaced apart from said outer MR/RF coil by a selected separation along said second axis for optimizing isolation between said inner and outer MR/RF coils.

14. The multi-resonant MR/RF coil structure of claim 13 wherein said outer coil exhibits a first resonant frequency and said inner coil exhibits a second resonant frequency.

15. The multi-resonant MR/RF coil structure of claim 14 wherein said inner and outer coils each have substantially rectangular shape on said surface.

16. The multi-resonant coil of claim 15, wherein said conductors comprise HTSC materials.

17. The multi-resonant MR/RF coil structure of claim 13, wherein said said inner and outer MR/RF coils have opposite helicity.

18. A method of uniformly distributing RF current density over a planar RF resonant structure comprising the steps of:
   providing at least one MR/RF coil having concentrically nested elemental spiral conductors, each said conductor enclosing an angle substantially different from a multiple of $2\pi$,
   coupling RF power to each said elemental spiral conductor, and
   geometrically offsetting each said adjacent elemental spiral conductor to obtain an RF phase shift between each of the adjacent elemental spiral conductors, that cause capacitive coupling between each said elemental spiral conductor and each of the adjacent conductors, resulting in an RF current density that is uniformly distributing over the RF resonant structure.

19. An NMR probe for use in an NMR apparatus, comprising:
   a pair of planer RF coils, each said planer RF coil comprising a plurality of substantially concentrically nested elemental spiral conductors, each said elemental spiral conductor having an inner end and an outer end, the inner ends of adjacent said elemental spiral conductors being confined by said pair of RF coils and geometrically displaced therebetween so that the RF phase of each of said spiral conductors is shifted with respect to each said adjacent elemental spiral conductor to obtain a desired RF phase difference $\Delta\Phi$, said pair of RF coils disposed spaced apart on a common axis and communicating mutually with one another to produce a desired RF magnetic field in the space therebetween, whereby RF coupling between said coil pair and an RF terminal occurs.

20. An NMR apparatus for examination of a composition of matter, comprising:
   a magnetic field of controllable properties,
   a RF source and a RF receiver selectively coupled to an RF probe assembly, said probe assembly comprising:
      at least a pair of planar RF coils, each said planar RF coil comprising spaced, concentric spiral conductors that each have an inner and outer ends disposed respectively within an inner and an outer side of each respective RF coil:
      each said spiral conductor having an inductance, each pair of said spiral conductors having distributed capacitance and a mutual inductance therebetween, whereby at least one resonant frequency characterizes the resonance component,
      each said spiral conductor of each said RF coil substantially supporting a standing wave corresponding to at least one said resonance,
   each said spiral conductor geometrically displaced in relation to at least one of the adjacent spiral conductors whereby a phase shift $\Delta\theta$ is introduced therebetween that allows for accumulation a substantial capacitance due to an RF offset phase difference $\Delta\Phi$.

21. A system for coupling a multi-resonant MR/RF coil with an RE source comprising:
   said multi-resonant MR/RF coil comprising nested inner and outer adjacent spiral conductors coaxially disposed on a common substrate forming outer and inner MR/RF coils respectively,
   each said spiral conductor of said outer and inner MR/RF coils having an inner end being confined within an inner side of the respective MR/RF coil and outer end disposed within an other side of the respective MR/RF coil, the inner ends of said adjacent elemental spiral conductors geometrically displaced towards each other by an angular amount $\Delta\theta$ to obtain a desired RF offset phase difference $\Delta\Phi$,
   said outer MR/RF coil having first and second symmetry axes on said surface, said inner MR/RF coil closely approaching the outer coil along said first axis and said inner MR/RF coil spaced from said outer MR/RF coil by a selected separation along said second axis,
   said outer and inner MR/RF coils exhibiting a first and second resonant frequency respectively,
   a first coupling loop for selectively coupling RF power at the second resonant frequency to said inner MR/RF coil said first coupling loop is disposed to concurrently superimpose a projection therefrom on both am interior region of said inner MR/RF coil and another region, said another region external to said Inner MR/RF coil and internal to said outer MR/RF coil, said first coupling loop having a butterfly shape, and
   a second coupling loop for selectively coupling RF power at the first resonant frequency to aid outer MR/RF coil, said second coupling loop is disposed to concurrently superimpose a projection therefrom on both an interior region of said inner MR/RF coil and another region, said another region external to said inner MR/RF coil and internal to said outer MR/RF coil, said second coupling loop having a simple shape.

* * * * *